United States Patent [19]

Ito

[11] Patent Number: 5,585,664
[45] Date of Patent: Dec. 17, 1996

[54] SEMICONDUCTOR INTEGRATED CIRCUIT DEVICE

[75] Inventor: Takao Ito, Tokyo, Japan

[73] Assignee: Kabushiki Kaisha Toshiba, Kawasaki, Japan

[21] Appl. No.: 595,964

[22] Filed: Feb. 6, 1996

Related U.S. Application Data

[63] Continuation of Ser. No. 364,755, Dec. 27, 1994, abandoned.

[30] Foreign Application Priority Data

Dec. 28, 1993 [JP] Japan ................................. 5-334191

[51] Int. Cl.$^6$ .................................................. H01L 23/552
[52] U.S. Cl. ................................ 257/659; 257/758
[58] Field of Search ........................... 257/659, 758; 307/246

[56] References Cited

U.S. PATENT DOCUMENTS

| | | | |
|---|---|---|---|
| 5,136,358 | 8/1992 | Sakai et al. | 257/659 |
| 5,309,015 | 5/1994 | Kuwata et al. | 257/659 |
| 5,329,155 | 7/1994 | Lao et al. | 257/659 |

FOREIGN PATENT DOCUMENTS

| | | |
|---|---|---|
| 0181600A3 | 5/1986 | European Pat. Off. . |
| 0353426A2 | 2/1990 | European Pat. Off. . |
| 0536972A2 | 4/1993 | European Pat. Off. . |
| 60-224244 | 11/1985 | Japan . |
| 3224232 | 10/1991 | Japan ................... 257/659 |
| 2089122 | 6/1982 | United Kingdom . |

*Primary Examiner*—Mark V. Prenty
*Attorney, Agent, or Firm*—Finnegan, Henderson, Farabow, Garrett & Dunner, L.L.P.

[57] ABSTRACT

Protection lines are arranged on both sides of and above a signal line, and ground lines are formed outside the protection lines and a ground line is formed above the protection line. A bias circuit is connected to the signal line and protection lines to set the potential of the protection lines equal to that of the signal line and set the impedance of the protection lines low. The signal line processing a small signal, is surrounded by the low-impedance protection lines of the same potential as that of the signal line, and thus crosstalk can be prevented from occurring between the lines, without causing the components of a high-frequency analog signal to attenuate.

6 Claims, 5 Drawing Sheets

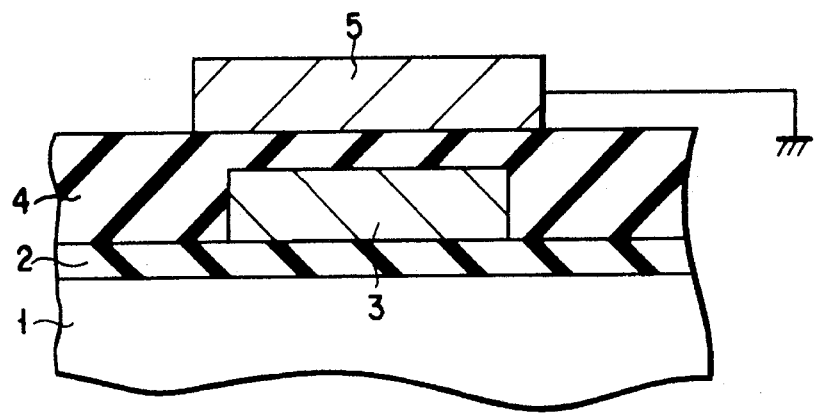
F I G. 1
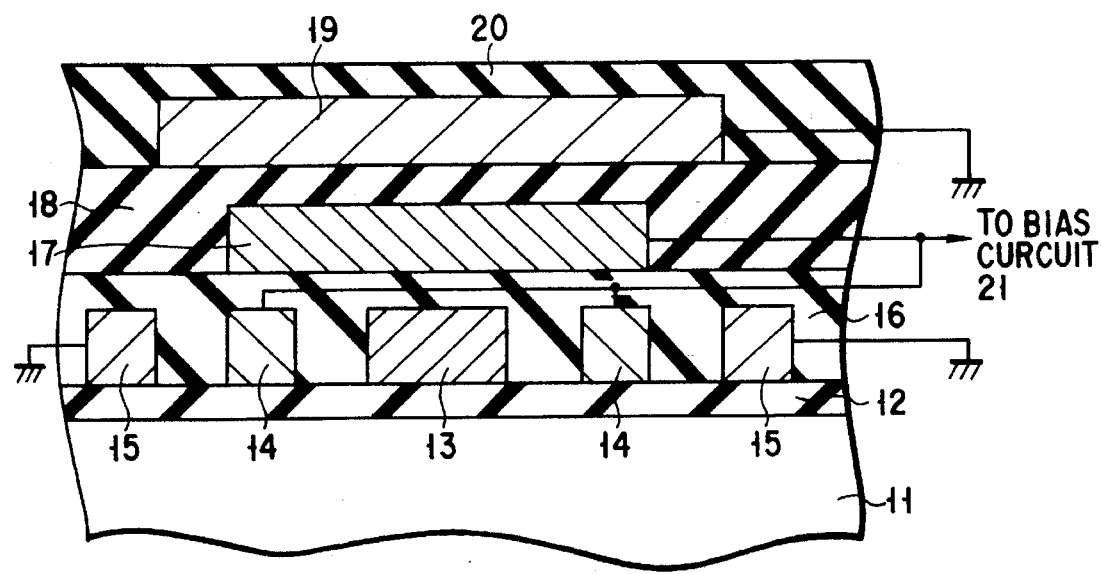
F I G. 2
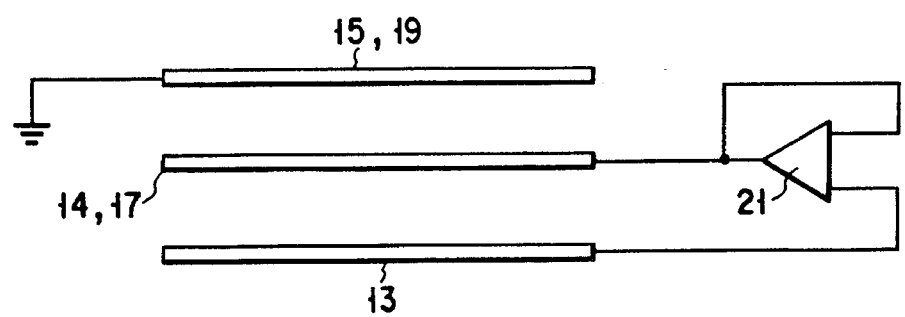
F I G. 3

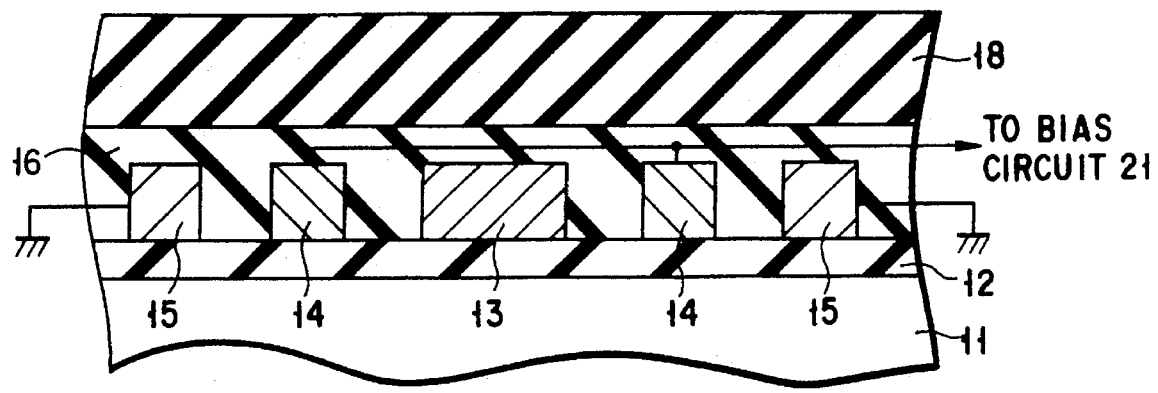
F I G. 7
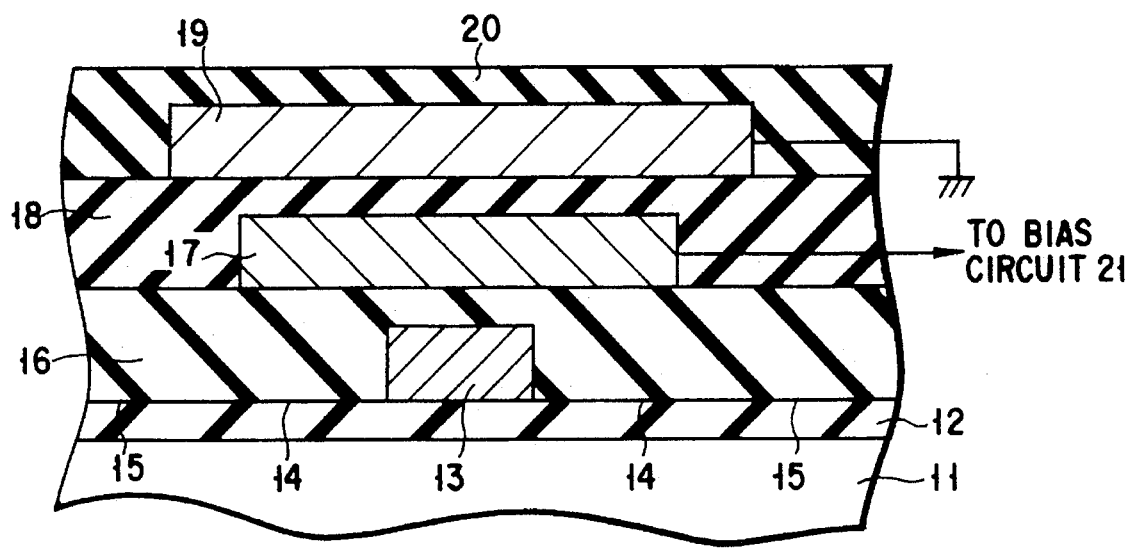
F I G. 8

2

SEMICONDUCTOR INTEGRATED CIRCUIT DEVICE

This application is a continuation of application Ser. No. 08/364,755, filed Dec. 27, 1994, now abandoned.

BACKGROUND OF THE INVENTION

1. Field of the Invention

The present invention relates to a semiconductor integrated circuit device and, more specifically, to an integrated circuit (IC) including an analog circuit and a digital circuit together.

2. Description of the Related Art

In a prior art integrated circuit (IC) including both an analog circuit and a digital circuit, a digital signal having a large amplitude and an analog signal having a small amplitude are processed on the single IC. It is thus necessary to prevent the digital signal from leaking into the analog signal. For example, the leakage of a signal through a substrate can be prevented by acquiring a substrate potential from each of analog and digital circuits or by forming a number of substrate contacts.

In the above integrated circuit, the wiring length is increased in accordance with a reduction in wiring interval and an improvement in degree of integration of IC; accordingly, a crosstalk is caused between wirings owing to a signal leakage therebetween. To prevent the crosstalk, as shown in FIG. 1, a ground (GND) line 5 is formed above wiring 3, which is formed on an insulation film 2 on the major surface of a substrate 1 and serves as a signal line, with an insulation film 4 interposed between the wiring 3 and GND line 5. The wiring (signal line) 3 is therefore covered with the GND line 5.

However, in the prior art integrated circuit described above, the parasitic capacitance between the wiring 3 and GND line 5 is increased when the wiring 3 is long or wide. Since the resistance of a high-frequency analog signal is usually represented by 1/jωC (ω: radian frequency, C: capacitance), the components of the high-frequency analog signal attenuate as the capacitance increases. Furthermore, the potential of the signal is likely to change because of a leak of small current flowing between wirings.

As described above, the prior art integrated circuit has a drawback in which when the wiring layer is covered with the GN line to prevent a crosstalk from occurring between the wires, the components of the high-frequency analog signal may attenuate or the potential of the signal may change.

SUMMARY OF THE INVENTION

It is accordingly an object of the present invention to provide a semiconductor integrated circuit device capable of providing both a digital circuit and a high-precision analog circuit together on a single device, and preventing a digital signal from leaking into an analog signal without attenuating the components of a high-frequency analog signal or changing the potential of the signal.

To attain the above object, there is provided a semiconductor integrated circuit device comprising:

a first wiring provided on an insulation film formed on a major surface of a substrate;

second wirings formed adjacent to the first wiring, with insulation films interposed therebetween; and a bias circuit for setting a potential of each of the second wirings in accordance with a potential of the first wiring.

With the above circuit arrangement, even though the signal line processing a small signal is lengthened, it can be protected from any influence of the other lines. Therefore, noise generated from the other lines can be suppressed, as can be crosstalk between the signal line and the other lines.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view of a prior art semiconductor integrated circuit;

FIG. 2 is a cross-sectional view of a semiconductor integrated circuit according to an embodiment of the present invention;

FIG. 3 is an equivalent circuit diagram of the semiconductor integrated circuit shown in FIG. 2; and FIGS. 4 to 12 are cross-sectional views each showing a semiconductor integrated circuit according to other embodiments of the present invention.

DETAILED DESCRIPTION OF THE PREFERRED EMBODIMENTS

Figure 4:
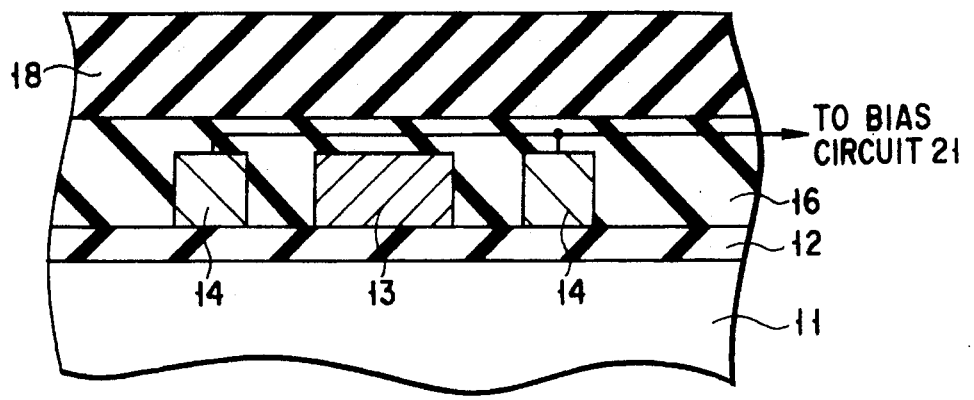

An embodiment of the present invention will now be described, with reference to the accompanying drawings.

FIG. 2 shows a constitution of an integrated circuit (IC) according to an embodiment of the present invention, and FIG. 3 shows an equivalent circuit of the IC of FIG. 2.

As illustrated in FIG. 2, the IC includes a semi-conductor substrate 11 on which, for example, a digital circuit and an analog circuit, neither of which is shown, are formed, an insulation film 12 formed on the major surface of the substrate 11, a signal line 13 of first wiring formed on the film 12, protection lines 14 of second wirings formed on both sides of the signal line 13, ground lines 15 of third wirings formed outside the lines 14, a protection line 17 of fourth wiring provided above at least the signal line 13 with an interlayer insulation film 16 between them, a ground line 19 of fifth wiring formed above the line 17 with an interlayer insulation film 18 between them, and a surface protection film 20 formed on the line 19. To improve in protection effect, it is preferable that the fourth wiring 17 extend over the second wirings 14 as well as the first wiring 13 so as to cover the second wirings, as shown in FIG. 2.

As illustrated in FIG. 3, a bias circuit 21 is connected to the signal line 13 and protection lines 14 and 17 to set the potential of each of the lines 14 and 17 equal to that of the line 13. The bias circuit 21, which is constituted of a voltage follower amplifier, enhances an impedance between the signal line 13 and the protection lines 14 and 17, and supplies the same potential as that of the signal line 13 to the protection lines 14 and 17 at a low impedance.

As shown in FIG. 3, the protection lines 14 and 17 are connected to one input terminal and an output terminal of the amplifier 21, whereas the signal line 13 is connected to the other input terminal thereof. For simplification of the drawings, in FIG. 2, and in subsequent Figures of cross-sectional views, the connection lines of the protection lines 14 and 17 to the bias circuit 21 are schematically shown, but the connection line between the signal line 13 and bias circuit 21 is not shown.

A method of manufacturing the above-described integrated circuit will now be described.

First an analog circuit and a digital circuit (neither is shown) are formed on a semiconductor substrate 11. Then an insulation film 12 is formed through a normal process, e.g., a CVD method. A contact (not shown) is formed in the insulation film 12 through the PEP (photo engraving process), and aluminum is deposited by sputtering. After that, the aluminum is patterned to form the signal line 13, protection lines 14, and ground lines 15. The protection lines 14 are arranged on both sides of the signal line 13 such that they are parallel with the line 13, and the ground lines 15 are formed outside and in parallel with the protection lines 14. The signal line 13 and protection lines 14 are connected to the bias circuit 21, and the ground lines 15 are connected to their respective grounds.

An interlayer insulation film 16 is formed by the CVD and a through hole (not shown) is formed by the PEP, with the result that the protection line 17 is formed on the interlayer insulation film 16 in the same manner as the protection lines 14 are formed. The protection line 17 connected to the bias circuit 21, is provided above the signal line 13 and covers it and, in other words, the protection line 17 is formed so as to cover the signal line 13, though the interlayer insulation film 16 is interposed between the lines 13 and 17. To improve protection effect, it is preferable to extend the protection line 17 over the protection lines 14 as well as the signal line 13, so as to cover the protection lines 14.

Similarly, an interlayer insulation film 18 is deposited by the CVD and a through hole (not shown) is formed by the PEP or the like. After that, a ground line 19 is formed on the interlayer insulation film 18 and connected to the GND. The ground line 19 is formed so as to cover the protection line 17. More specifically, the ground line 19 is formed above the protection line 17 so as to cover the line 17 in the thickness direction of the substrate 11, though the interlayer insulation film is interposed between the protection line 17 and ground line 19. After that, a surface protection film 20 for protecting the surface of the resultant structure is deposited by sputtering or the like, and a pad (not shown) is formed, thus completing the integrated circuit.

In the foregoing integrated circuit, the signal line 13, which processes a small signal, is surrounded by the low-impedance protection lines 14 and 17 having the same potential as that of the line 13 and by the ground lines 15 and 19 connected to the GND. Therefore, no crosstalk can be caused between the signal line 13 and the protection lines 14 and 17.

Since the interconnection between the protection lines 14 and 17 and the other lines (not shown) is protected by the ground lines 15 and 19, crosstalk is difficult to cause between them. Since, moreover, the protection lines 14 and 17 are low in impedance, they are not influenced greatly by the parasitic capacitance or the leak of small current, with the result that the great influence can be prevented from being exercised on the signal line 13.

Consequently, the integrated circuit of the present invention overcomes the problems of the prior art circuit in which the parasitic capacitance between the signal and ground lines is increased, the components of a high-frequency analog signal are attenuated, and the potential of the signal is varied with the leak of a small current between wirings.

In the above embodiment, since the signal line processing a small signal is surrounded by the low-impedance protection lines of the same potential as that of the signal line, the parasitic capacitance between the signal line and ground lines can be prevented from increasing, and noise generated from the other wirings can be suppressed, as can be crosstalk between the signal line and the other wirings. Consequently, the signal line can be protected irrespective of the length or area thereof and, even when both a digital circuit and a high-precision analog circuit are integrated on a single device, the performance of the device itself can be sufficiently maintained.

In the above embodiment, each wiring is constituted of aluminum. However, the present invention is not limited to this, but the first and second wiring can be constituted of polysilicon, polycide, or the like.

Figure 5:
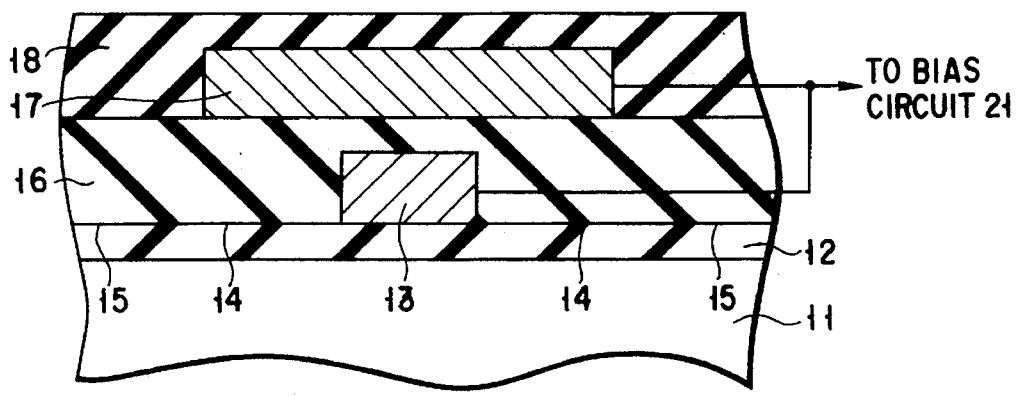
Figure 6:
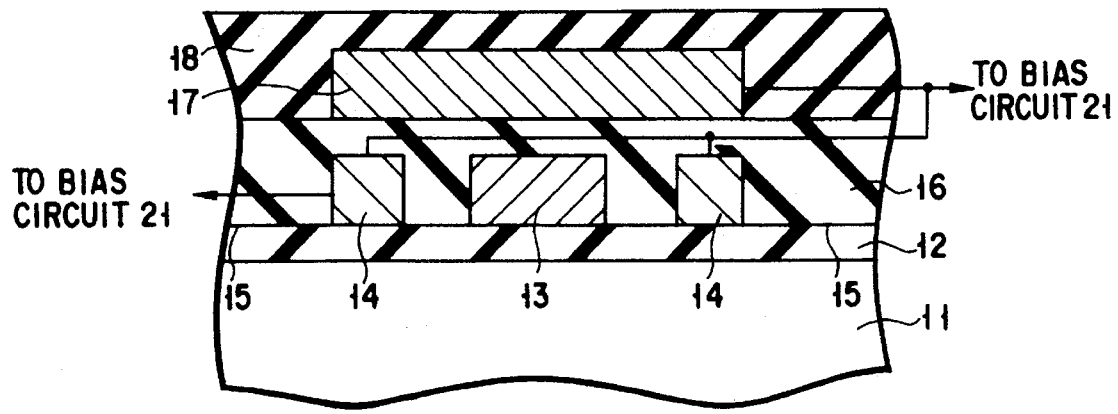
Figure 9:
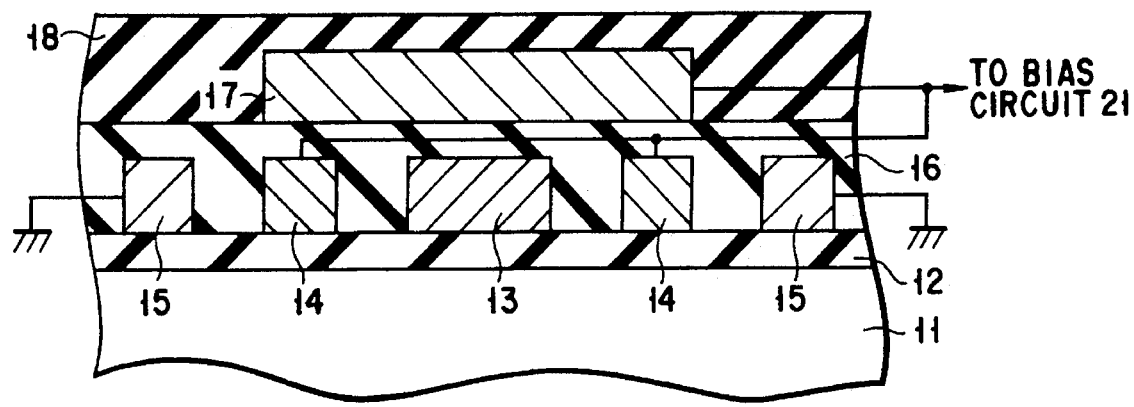
Figure 10:
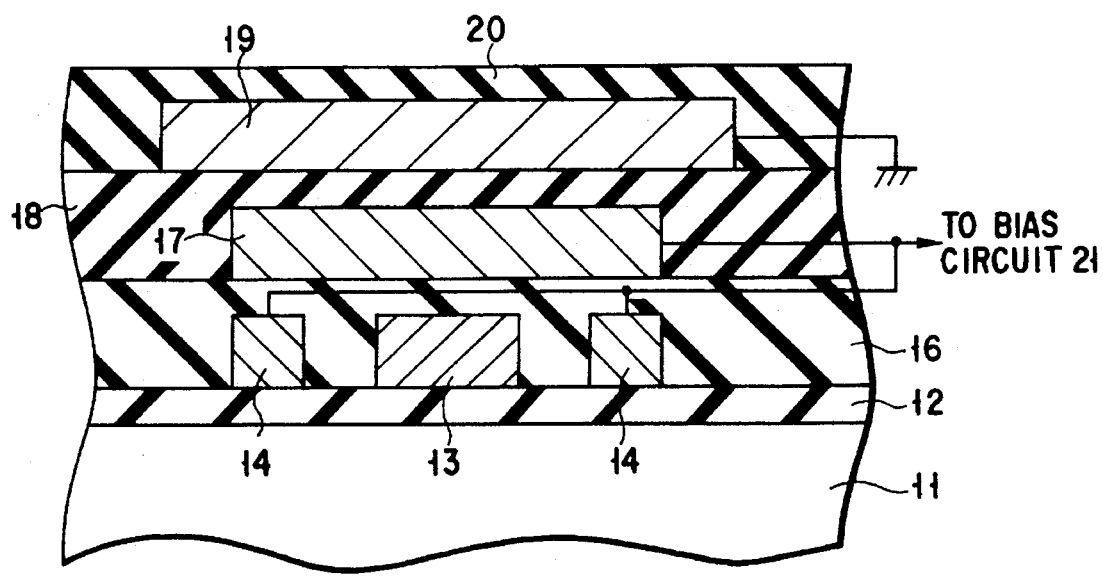

In the above embodiment, the first wiring serves as a signal line, and the protection lines are formed above and on both sides of the signal line. As shown in FIGS. 4 and 5, however, a protection line or protection lines can be formed either on both sides or above the signal line. The integrated circuit of the present invention has only to include at least the first wiring 13 of the signal line and the protection lines 14 or protection line 17. FIG. 6 shows an integrated circuit comprising both the protection lines 14 and 17. FIG. 7 shows an integrated circuit including protection lines 14 and ground lines 15 outside the lines 14. FIG. 8 illustrates an integrated circuit having a protection line 17 and a ground line 19 above the line 17. FIG. 9 shows an integrated circuit including both protection lines 14 and 17 and ground lines 15 outside the lines 14. FIG. 10 illustrates an integrated circuit comprising protection lines 14 and 17 and ground lines 15 and 19.

Figure 11:
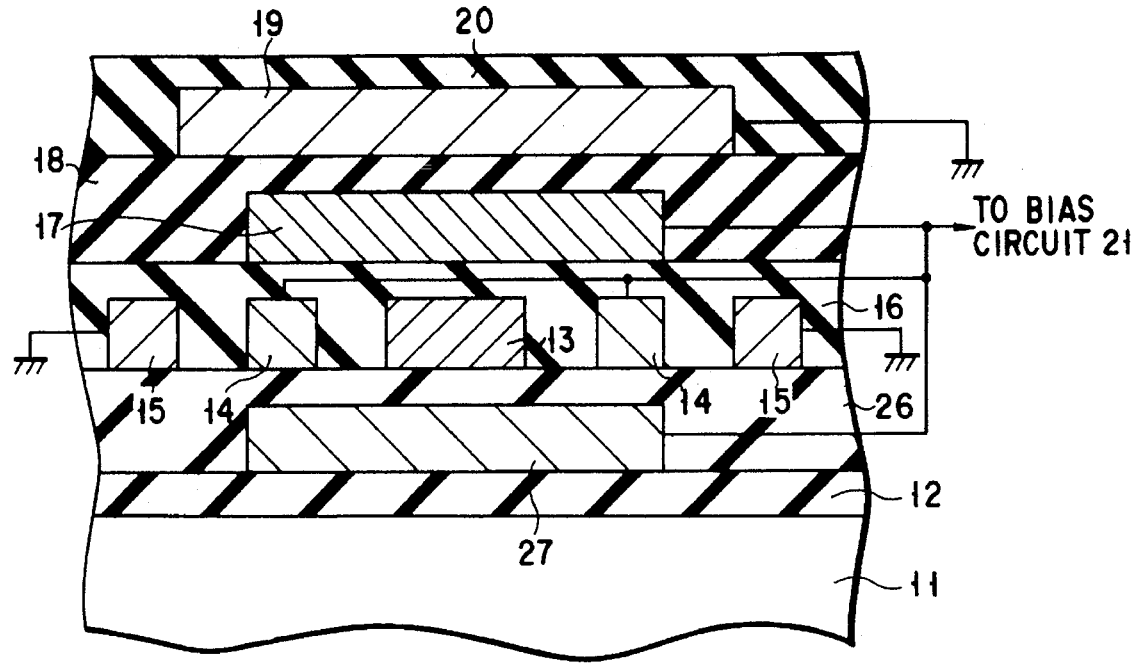
Figure 12:
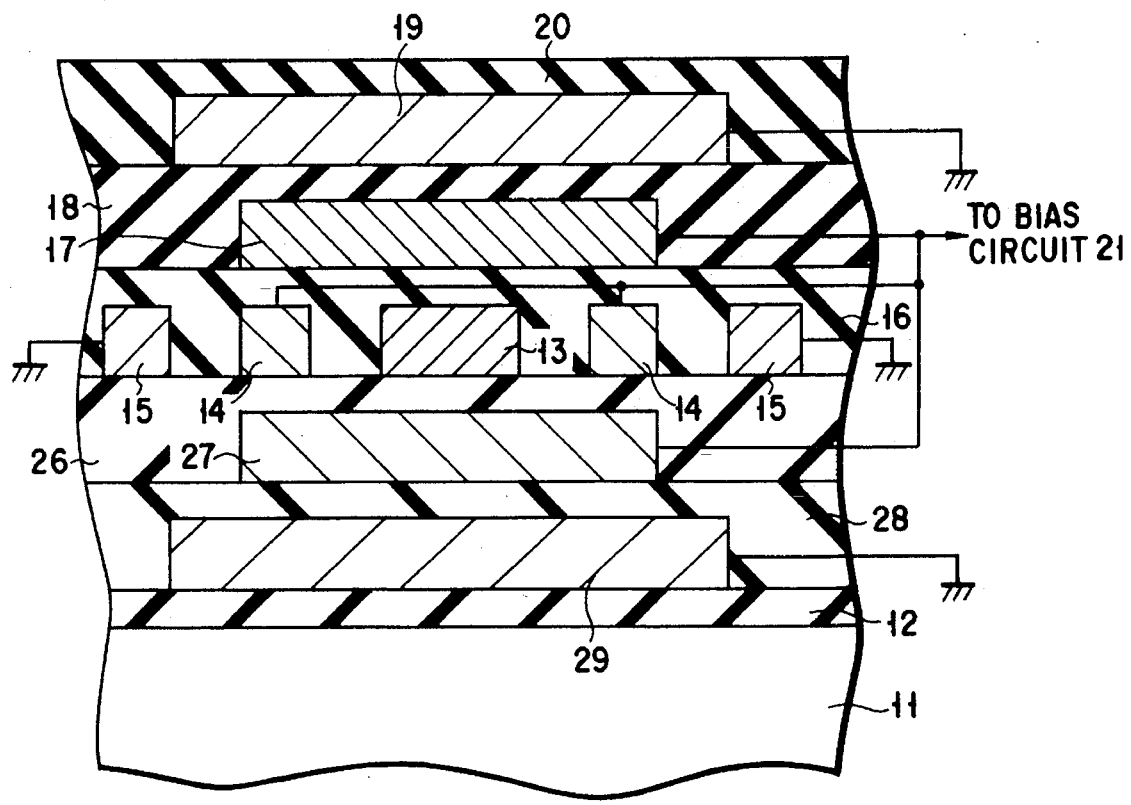

The integrated circuit of the first embodiment has a three-layered wiring structure, and the signal line is the lowest layer of the structure. For example, as shown in FIGS. 11 and 12, the number of wiring layers can be four or more, and a protection line can be formed under and alongside the signal line. Furthermore, a ground line can be formed for the protection line. In FIG. 11, a protection line 27 is formed under a signal line 13 with an insulation film 26 interposed between them. The protection line 27 is formed so as to cover the signal line 13 and preferably extends so as to cover protection lines 14. In FIG. 12, a ground line 29 is provided under a protection line 27 with an insulation film 28 interposed between them. The protection effect of the circuits shown in FIGS. 11 and 12 is improved more greatly than that of the circuit shown in FIG. 2.

According to the foregoing first embodiment, the signal line and protection lines are interposed between the ground lines. However, as shown in FIGS. 4, 5 and 6, the ground lines need not be always provided.

In the embodiments shown in FIGS. 4, 5, 6, 7 and 9, the insulation film 18 is used as a surface protection film. In the embodiments shown in FIGS. 4 and 7, the insulation film 18 may be omitted and, in such case, the insulation film 16 is used as a surface protection film.

Various changes and modifications can be made without departing from the scope of the subject matter of the present invention.

According to the above-described semiconductor integrated circuit device of the present invention, a digital circuit and a high-precision analog circuit can be formed together on a single device, and a digital signal can be prevented from leaking into an analog signal, without attenuating the components of a high-frequency analog signal or varying the potential of the signal.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit device comprising:
   a first wiring provided on an insulation film formed on a substrate;
   second wirings formed adjacent to said first wiring, with insulation films interposed therebetween; and
   a bias circuit for setting a potential of each of said second wirings to be in accordance with a potential of said first wiring;
   wherein an impedance of the second wirings is set to be lower than an impedance of the first wiring.

2. The device according to claim 1, wherein said bias circuit sets the potential of each of said second wirings equal to the potential of said first wirings.

3. The device according to claim 1, wherein said bias circuit includes an amplifier which receives the potential of said first wiring at a high impedance and supplies a low-impedance signal to said second wirings in accordance with the potential.

4. The device according to claim 1, further comprising third wirings formed adjacent to said second wirings, with the insulation films interposed therebetween, and wherein said first wiring serves as a signal line, said second wirings serve as protection lines, and said third wirings serve as ground lines.

5. The device according to claim 4, further comprising another protection line formed adjacent to said first wiring, with an insulation film interposed therebetween.

6. The device according to claim 1, further comprising a ground line formed adjacent to said another protection line, with an insulation film interposed therebetween.

* * * * *

UNITED STATES PATENT AND TRADEMARK OFFICE
CERTIFICATE OF CORRECTION

PATENT NO. : 5,585,664
DATED : December 17, 1996
INVENTOR(S) : Takao ITO

It is certified that error appears in the above-indentified patent and that said Letters Patent is hereby corrected as shown below:

Claim 2, Column 6, Line 5, "first wirings" should read --first wiring--.

Claim 3, Column 6, Line 8, "first wiring" should read --first wirings--.

Signed and Sealed this

Twenty-fourth Day of June, 1997

BRUCE LEHMAN

*Attest:*

*Attesting Officer*      Commissioner of Patents and Trademarks